United States Patent
Shi et al.

(10) Patent No.: US 11,605,721 B2
(45) Date of Patent: Mar. 14, 2023

(54) SPUTTERING ELECTRODE WITH MULTIPLE METALLIC-LAYER STRUCTURE FOR SEMICONDUCTOR DEVICE AND METHOD FOR PRODUCING SAME

(71) Applicants: Kaixuan Shi, Shenzhen (CN); Haodian Shi, Shenzhen (CN); Yanqing Wu, Shenzhen (CN); Anping Hu, Shenzhen (CN); Xibei Yu, Shenzhen (CN)

(72) Inventors: Kaixuan Shi, Shenzhen (CN); Haodian Shi, Shenzhen (CN); Yanqing Wu, Shenzhen (CN); Anping Hu, Shenzhen (CN); Xibei Yu, Shenzhen (CN)

(*) Notice: Subject to any disclaimer, the term of this patent is extended or adjusted under 35 U.S.C. 154(b) by 166 days.

(21) Appl. No.: 17/006,874

(22) Filed: Aug. 30, 2020

(65) Prior Publication Data
US 2022/0069099 A1  Mar. 3, 2022

(51) Int. Cl.
| | |
|---|---|
| *H01L 29/45* | (2006.01) |
| *H01L 21/443* | (2006.01) |
| *H01L 29/22* | (2006.01) |
| *H01L 29/93* | (2006.01) |
| *C23C 14/35* | (2006.01) |
| *C23C 14/18* | (2006.01) |
| *C22C 21/00* | (2006.01) |

(Continued)

(52) U.S. Cl.
CPC .............. *H01L 29/45* (2013.01); *C23C 14/18* (2013.01); *C23C 14/35* (2013.01); *H01L 21/443* (2013.01); *H01L 29/22* (2013.01); *H01L 29/93* (2013.01); *C22C 14/00* (2013.01); *C22C 19/05* (2013.01); *C22C 21/00* (2013.01); *H01C 7/008* (2013.01)

(58) Field of Classification Search
CPC . H01L 29/45; H01L 29/7869; H01L 27/1259; H01L 21/02197; H01L 28/40; H01L 21/02194; H01L 33/44; C22C 14/00; C22C 19/05; C22C 21/00; C23C 14/35; H01C 7/008; H01C 7/006; H01C 7/041; H01C 7/1006; H01C 7/1013; H01C 7/021
See application file for complete search history.

(56) References Cited

U.S. PATENT DOCUMENTS

| | | | |
|---|---|---|---|
| 2010/0117483 A1* | 5/2010 | Tanaka | H03H 9/02992 310/313 B |
| 2017/0345577 A1* | 11/2017 | Nakaiso | H01G 4/008 |
| 2018/0068788 A1* | 3/2018 | Kobayashi | C23C 18/1279 |

* cited by examiner

*Primary Examiner* — Wasiul Haider

(57) ABSTRACT

An electrode with multiple metallic-layers structure formed by a magnetron sputtering technique for a semiconductor device and method for producing same is disclosed. The ceramic device includes at least one from selected group consisting of ZnO-MOV (metal oxide varistors), BaTiO3-PTC (positive temperature coefficient) thermistors, Mn3O4-NTC (negative temperature coefficient) thermistors, and capacitors. The multiple metallic-layers include a sputtered buffer layer and a sputtered electrical contact layer. The buffer layer includes at least one alloy selected form group consisting of NiCr (Ni from 50-90 wt %), TiNi (Ti from 40-60 wt %), and AlNi (Al from 40-70 wt %) and the thickness of this layer is from greater than zero to less than 100 nm. The electrical contact layer includes at least one of Cu, Ag, Pt, Au, or combination. More specifically, the electrode includes one of NiCr/Cu system, NiCr/Ag system, NiCr/Cu/Ag system, TiNi/Cu/Ag system, or AlNi/Cu/Ag system. The thickness ratio of the electrical contact layer to the intermetallic barrier layer is from 1 to 4.

8 Claims, 3 Drawing Sheets

(51) Int. Cl.
*H01C 7/00* (2006.01)
*C22C 19/05* (2006.01)
*C22C 14/00* (2006.01)

SPUTTERING ELECTRODE WITH MULTIPLE METALLIC-LAYER STRUCTURE FOR SEMICONDUCTOR DEVICE AND METHOD FOR PRODUCING SAME

TECHNICAL FIELD

An electrode with multiple metallic-layers structure formed by sputtering technique for a semiconductor device, such as ceramic thermistor or varistor, and method for producing same.

BACKGROUND

Metal oxide varistors (MOV), such as Zinc oxide (ZnO) varistors, are produced by sintering ZnO powder together with small additives, which are popular ceramic semiconductor devices and widely used in electric circuits and systems as voltage-clamping or surge-arrester owing to their extremely nonlinear current-voltage characteristics. PTC (positive temperature coefficient) ceramic device, such as a $BaTiO_3$-based PTC, is a Ferro-electronic material with many fine electronic properties such as resistance-temperature characteristics, current-time characteristics, voltage-current characteristics. A ceramic thermistor with a positive temperature coefficient can be manufactured by the resistance adjusting method. Therefore it is widely used in electronic products such as temperature sensors, heaters, motor components, degauss etc. Manufacturing electrode on ceramic MOV and/or PTC is a process of vital importance. High quality electrode play important role in the device performance. The properties of electrodes would influence relative properties of the MOV and/or PTC devices, such as ohmic contact, aging characteristics, welding performance, etc.

Traditional methods applied in manufacturing MOV and/or PTC electrodes include the electroless nickel-plating, fired alloy method, and screen printing (SPE). The electroless nickel plating was quite complex in the process and brought in poisonous CI in manufacturing. The process of fired alloy method was cheap and simple, but its products had low impact current and poor aging characteristics. Screen printing electrode (SPE) has been widely employed to produce silver electrodes for applications such as transistors, sensors, solar cells, and touch screens. The relatively low firing temperature of LTCC enables working metals such as gold, silver, and copper to be used. These metals can be easily deposited using the screen-printing process. This property is especially important for the fabrication of the electrochemical sensor electrodes, where metals such as gold and silver are widely used. Silver is widely used to produce an inexpensive and stable Ag/AgCl reference electrode using various chlorination methods. Gold is often used as a working or counter electrode as many surface chemistries required to immobilize various antibodies, enzymes, or mediator molecules on this metal are well documented. Although gold is expensive, it is widely used for its biocompatibility and lack of oxidation. But screen printing brought in serious pollution in the manufacturing process and its metal coating contained lead, hexavalent chromium and other harmful elements. The products of SPE could not withstand the melting and corrosion of high-temperature lead-free soldering. Poor corrosion resistance of the silver electrode layer against lead-free solder. As the solid solubility of silver and tin is relatively high, solder can easily etch a silver layer at a high temperature. Nowadays, owing to the concern of environmental protection, products are manufactured using the lead-free soldering technique. To avoid pseudo soldering and melting silver, the Ag solder indicative of a Sn—Ag—Cu solder alloy with a higher silver content at a weight percentage of silver 3% is used for soldering and thus becomes a cost-down barrier of products. Meanwhile, because of the high mutual solubility of tin and silver in a lead-free solder, after products are powered on and operated for a long time, the silver electrode layer can be easily etched by the solder, such that the electrode has a reduced adhesion force and even becomes detached. Therefore, once the electrode becomes detached, transportation equipment, such as vehicles, using such type of varistors could be in a dangerous situation. Since better performance of electronic products as well as environment-friendly standards are mentioned in present application, the above traditional electrode forming methods are not suitable in the production of MOV and/or PTC electrodes any more. Instead, magnetron, the green technology began to take their places in manufacturing process of MOV and/or PTC electrodes. The sputtering had many advantages: its products had low resistance and good adhesion, slow aging process and were able to withstand high power impulse. Sputtered Ni or alloy on the PTCR through magnetron sputtering for the electrodes demonstrated better properties than those made from fired-Al.

The electrode component in accordance with the present invention may be applied to one of metal oxide varistor (MOV), gas sensitive resistor, PTC (Positive temperature coefficient) thermistor, NTC (Negative temperature coefficient) thermistor, piezoelectric ceramic, and ceramic capacitor. The shape of the electrode component may be square, round, oval, tubular, cylindrical or pyramidal. Given a MOV as an example, a surge withstand capability ($I_{max}$) of the electronic component in the MOV against combination wave increases about 50%. The preparation method for MOV or PTC includes: performing solid phase synthesis to obtain the main crystal phase component, subjecting the main crystal phase component and the modified additives to wet ball milling, and drying to obtain the ceramic dielectric powder material with an excellent dielectric property. The multilayer ceramic capacitor prepared from the low-temperature sintering ceramic dielectric material is available for sintering in a reducing atmosphere at 1240+/−20° C., ranges from 3400-3800 in dielectric constant.

As discussed in S. Swann, Magnetron Sputtering, Phys. Technol, 19 (1988), magnetron sputtering has emerged to complement other vacuum coating techniques such as thermal evaporation and electron-beam evaporation. However these techniques show certain disadvantages. In particular, alloys and refractory metals cause problems because of differences in alloy constituent vapor pressures and their high melting points (the need to run sources very hot thereby affecting your coated articles). In addition compounds can dissociate into their chemical constituents at the low evaporation pressures used. Magnetron sputtering overcomes these problems and has many other advantages. The primary advantages are (1) high deposition rates, (2) ease of sputtering any metal, alloy or compound, (3) high-purity films, (4) extremely high adhesion of films, (5) excellent coverage of steps and small features, (6) ability to coat heat-sensitive substrates, (7) ease of automation, and (8) excellent uniformity on large-area substrates, e.g. architectural glass. Several terms may be met describing the sputtering process—catholic sputtering. Diode sputtering, KF or DC sputtering. Ion-beam sputtering, reactive sputtering—but all these are variants of the same physical phenomenon. Sputtering is the process whereby atoms or molecules of a material are ejected from a target by the bombardment of high-energy particles. More significantly, catholic sputtering is the process discussed here and in this case the bombardment is by positive ions derived from an electrical discharge in a gas. Material is ejected from the target in such a way as to obtain usable quantities of material which can be coated directly onto substrates. Under the action of the electric field E, the electron e accelerates to collide with the argon atom on the way to the substrate, and the electron with sufficient energy (about 30 eV) ionizes another electron e and Ar+. The electron flies to the substrate, and Ar+ accelerates to the cathode target under the action of the electric field E and bombards the target surface with high energy, causing the target material to sputter. In sputtered particles, neutral target atoms or molecules are deposited on the surface of the substrate to form a thin film. In the process of accelerating the secondary electron el to the substrate, the Lorentz force of the magnetic field B acts on it to make a gyratory motion near the target in the form of the compound of the cycloid and the helix. The moving path of electron el is not only long, but also bound by the electromagnetic field in the plasma area close to the target surface, where a large number of ions Ar+ are ionized to bombard the target surface, thereby achieving the "high-speed deposition" feature of magnetron sputtering.

SUMMARY OF INVENTION

An aspect of the present invention relates to a multiple metallic layers of electrodes for semiconductor device with ceramic thermistors and/or varistors by sputtering technique and corresponding manufacturing process is disclosed. The ceramic substrates comprise at least one from the selected group consisting of ZnO-MOV or $BaTiO_3$-PTC Thermistors, $Mn_3O_4$-NTC Thermistors, Capacitors etc. After the intermediate layers are formed on the surfaces of the ceramic substrate, the electrode layers are further respectively formed on the intermediate layers to enhance ohmic contact resistance and binding strength between the electrode layers and the ceramic substrate. The multiple metallic layers include a sputtered intermetallic buffer layer and a sputtered electrical contact layer. The process includes steps of (a) depositing a first metal layer, which serves as an metallic buffer layer, including at least one alloy selected form group consisting of NiCr (more than 50 wt % Ni), TiNi (Ti from 40-60 wt %), and AlNi (Al from 40-70 wt %) and the thickness of this layer is from greater than zero to less than 100 nm. (b) Depositing a second metal on the first metal layer, which is the electrical contact layer, including at least one of Cu, Ag, Au, Pt or combination. The thickness ratio of the electrical contact layer to the intermetallic buffer layer is from 1 to 4. (c) Optional additional heat treatment.

BRIEF DESCRIPTION OF THE DRAWINGS

For a better understanding of the embodiments, reference will now be made by way of example only to the accompanying figures in which.

DETAILED DESCRIPTION

Figure 1:
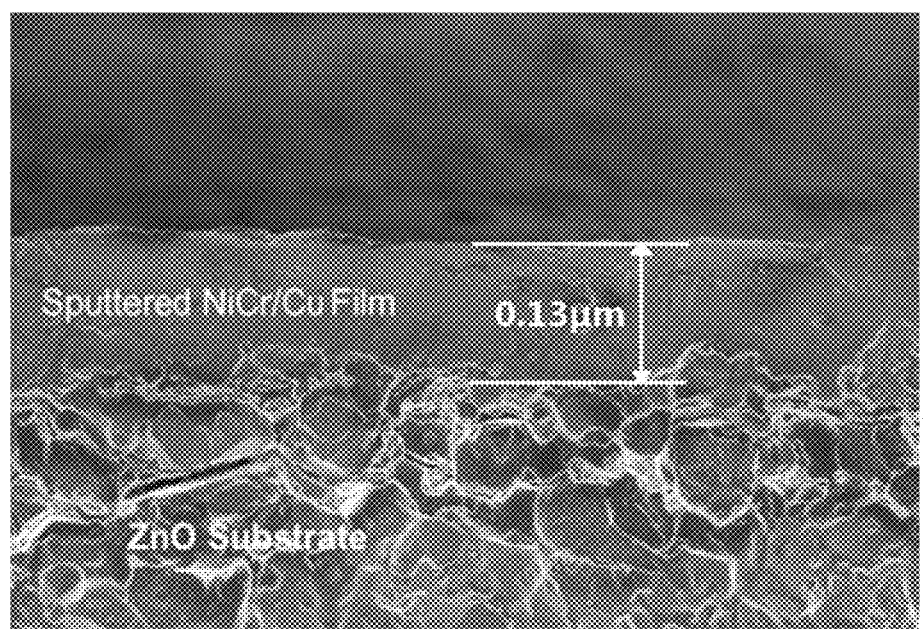
FIG. 1 is a SEM cross-section image of the sputtered NiCr/Cu multiple metal layer electrode on a ZnO-MOV ceramic substrate.

The present disclosure is an electrode formed by a multiple metallic-layers for semiconductor device with ceramic thermistors and/or varistors by sputtering technique and manufacturing process thereof, which compared with traditional electrode manufacturing technique of Ag screen-printed electrode (SPE). A semiconductor device that provides a substrate having a primary surface and a secondary surface opposite to the primary surface. The primary surface provides a semiconductor active device. The substrate has a substrate via that pierces from the secondary surface to the semiconductor active device in the primary surface, and a metallic electrode formed on the primary surface. The ceramic substrate comprise one selected form group consisting of ZnO-MOV or $BaTiO_3$-PTC. The multiple metallic-layers include a sputtered intermetallic buffer layer and a sputtered electrical contact layer and the buffer layer can be formed in composition gradient change in order to decreasing the stress between interfaces. The metallic buffer layer include at least one alloy selected form group consisting of NiCr (Ni from 60-90 wt %), TiNi (Ti from 40-60 wt %), and AlNi (Al from 40-70 wt %) and the electrical contact layer include at least one selected form group consisting of Cu, Ag, Au, Pt or combination. The process includes steps of: (a) depositing a first metallic layer—a buffer layer with the thickness from greater than zero to less than 100 nm. (b) depositing a second metal on the first metal layer, which is the electrical contact layer. More preferably, the electrode comprises one of multiple metal layers system, such as: NiCr/Cu system, NiCr/Ag system, NiCr/Cu/Ag system, TiNi/Cu/Ag system, on AlNi/Cu/Ag system. The thickness ratio of the electrical contact layer to the intermetallic buffer layer is from 1 to 4. (c) Optional additional heat treatment for stress release at temperature 100-150° C. for less than 30 minutes.

Traditional screen-printed electrode (SPE) with further solidifying technique: the electrode paste is printed on the surface of a ceramic body which is then fed into a sintering furnace filled with nitrogen after dried; sintering is performed after staged temperature rise to 480-580° C., thereby surface metal particle gaps are tightened and a compact electrode layer with good conductivity is formed. In preparation for the Ag paste, the highly loaded silver paste used in this application is synthesized with small particle size to facilitate passing of narrow screen openings as well as annealing at low temperature. Silver particles are first synthesized from silver nitrate solution using di-ethanolamine (DEA) as a reducing agent and poly (acrylic acid) (PAA) as a capping agent. The size of these particles is determined to be ~5 nm by transmission electron microscopy. Achieving high solids loading at this size scale is difficult because of the high excluded volume associated with each PAA-coated particle, Therefore, a ripening procedure is used to increase the average size to ~200 nm and create a broad size distribution (10-500 nm). These particles are then concentrated to produce a 77 wt % (24.2 vol %) silver ink in an ethylene glycol/water solution.

The vacuum magnetron sputtering equipment may be one-chamber, two-chamber or continuous inline sputtering equipment, and the target may be a planar target or a cylindrical target. Prior to the sputtering, the sputtering power and the sputtering time for each target are configured. The sputtering equipment then starts vacuuming with degree of vacuum in a range of $5 \times 10^{-6}$ and $5 \times 10^{-8}$ torr. Inert gas is further added to the sputtering chamber. The inert gas may be nitrogen or argon, and has a flow rate in a range of 45-50 mils. A lower pressure enables more uniform films to be deposited. The temperature in the sputter deposition chamber during deposition processes may vary from room temperature to 150° C., and the forward power applied to one or more targets to form each seed layer is usually in the range of 20 W to 5000 W.

The semi-conductive ceramic body contacts with many metal electrodes and forms resistive formation is because the chemisorbed layer of superficial oxygen causes, is referred to as the barrier layer model. This model thinks that behind the n N-type semiconductor N ceramic surface adsorb oxygen molecule, the electron production polarization in oxygen molecule and the ceramic body surface is converted into chemisorbed by physical absorption. This moment, surface carrier concentration reduced, has formed the space charge region on the ceramic body surface, and has promptly formed the resistive formation that is equivalent to electronic barrier because electronics is in bond. Whether the N-type semiconductor N pottery obtain good ohmic contact with metal, and the surface electronic state is topmost influencing factor. Just being based on this concept, destroying the oxygen adsorption layer on ceramic body surface, is the pre-requisite to obtain a good ohmic contact. The purpose the instant invention is to find an improved ohmic contact electrode that is applicable to the PTCR material in view of the above.

This enhancement is benefit from the good interface between sputtered electrodes and ceramic substrate as well as the low temperature during magnetron sputtering process. Nano-electrode semiconductor ceramic components, such as thermistors, varistors, are in accordance with the latest development trends for ultra-high temperature, ultra-high energy and ultra-miniaturization in modern electrical appliances and instrument industries.

First Embodiment

Substrate: ZnO-MOV sintered ceramic; Sputtering target: NiCr for buffer layer: including 80 wt % Ni-20 wt % Cr. Cu target for electrical contact layer with purity at least 99.99%. Sputtering conditions: base vacuum $5 \times 10^{-7}$ Pa. Ar gas flow rate 80 ml/s, substrate at room temperature, deposition rate 10 nm/min. (Ni/Cr), 25 nm/min. (Cu). The forward power applied the targets to form each seed layer is 500 W.

Deposition result: NiCr thickness 30 nm, Cu film 100 nm, thickness ratio the electrical contact layer to the intermetallic buffer layer is about 3.3. Cu grain size as deposed is about 1-5 nm.

Second Embodiment

Substrate: BaTiCO3-based PTC ceramic: Sputtering target: NiCr for buffer layer: including 80 wt % Ni-20 wt % Cr. Cu target for electrical contact layer with purity at least 99.99%. Sputtering conditions: base vacuum $5 \times 10^{-7}$ Pa, Ar gas flow rate 80 ml/s, substrate at room temperature, deposition rate 10 nm/min. (Ni/Cr), 25 nm/min. (Cu). The forward power applied the targets to form each seed layer is 500 W.

Deposition result: NiCr thickness 30 nm, Cu film 100 nm, thickness ratio the electrical contact layer to the intermetallic buffer layer is about 3.3. The Cu grain size as deposed is about 1-5 nm.

Comparison Example

Traditional screen-printed electrode (SPE) with further solidifying technique: applying electrode paste is printed on the surface of a ceramic body which is then fed into a sintering furnace filled with nitrogen after dried; sintering is performed after staged temperature rise to 550-585° C., forming electrode with thickness 3,000 nm and Ag grain size about 500 nm.

TABLE 1

| P/N | Test Couditon | Results(%) Max. | Min. | Ave. | Remarks Spec. |
|---|---|---|---|---|---|
| 1)WLR-G14D681K | 6KV/3KA 90°/270° | 1.6 | 0.4 | 1.3 | $\Delta$Vn/Vn $\leq \pm$ 10% |
| 2)WLR-G15D821K | 20 hits | 0.6 | 0.2 | 0.4 | |
| 3)WLR-G22D681K | 10KV/5KA 90°/270° | 0.7 | 0.1 | 0.4 | |
| 4)WLR-G22D821K | 20 hits | 0.6 | 0.1 | 0.5 | |

TABLE 2

| Items | Sputtering-Electrode on ZnO (D * T = 12.5 * 2.7 mm) | Traditional-SPE Electrode (D * T = 13.5 * 2.7 mm) | Compare Results |
|---|---|---|---|
| Zero-power Contact Resistance ($\Omega$) | 0.4 | 0.7 | 42.8% lower |
| Maximum Overload Current (A) | 24 | 18 | 33.3% higher |
| Steady State Damp Heat Test (56 days: 85 ± 3% R.H./85 ± 2° C.) $\Delta$Rn/Rn(%) | 2.3 | 4.6 | 50% improver |

As shown in the table 1, The lightning protection performance of nano-electrode products have advantages over the micron electrode, products and have passed the IEC61051-1-2018 composite, wave testing standard requirements.

Figure 2:
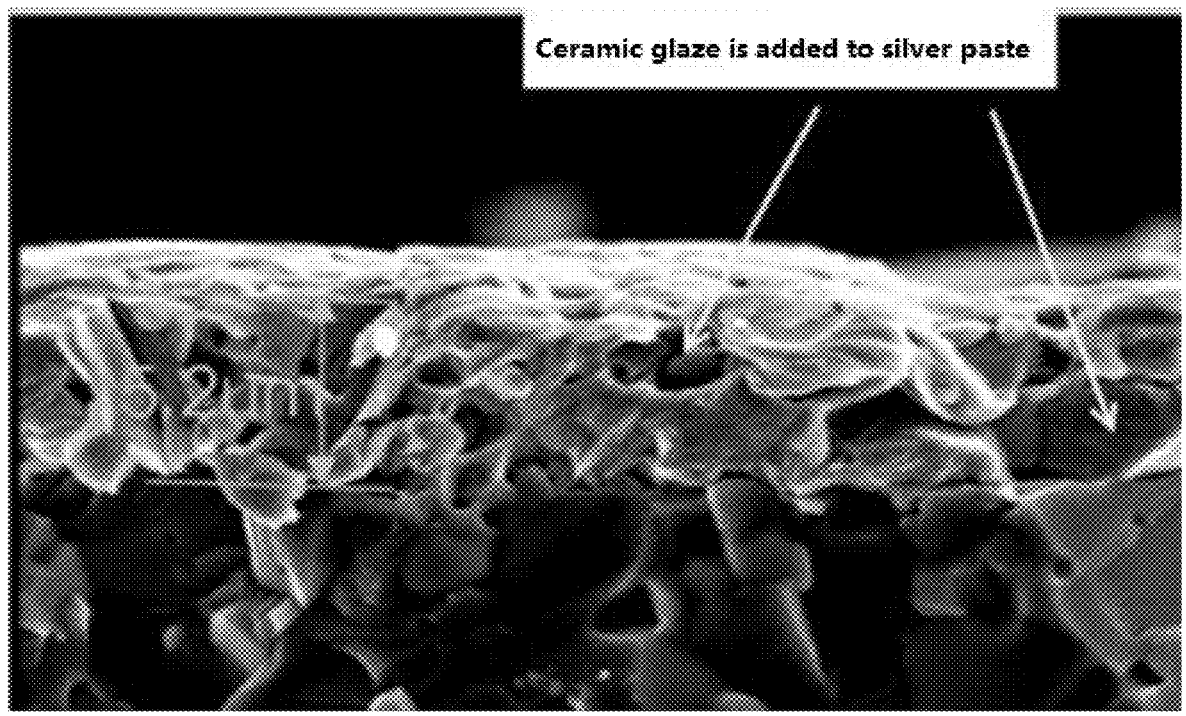
FIG. 2 is a SEM cross-section image of the traditional Ag solidified net-printing electrode on a ZnO-MOV ceramic substrate.

As shown in the SEM image of FIG. 1, Sputtering NiCr/Cu electrode has dense and fine structures and there is no gap between the electrode and ceramic substrate, which is contrary to the electrode manufactured by the traditional screen-printed electrode (SPE) technique (SEM image shown in FIG. 2). Since sputtering is the process whereby atoms or molecules of a material are ejected from a target by the bombardment of high-energy particles, an improved interface between electrode and ceramic substrate has been obtained.

As shown in the table 2, compared to the traditional screen-printed electrode (SPE) technique, sputtering NiCr/Cu electrode decreasing the "Zero-power contact resistance" about 43%, increasing the maximum overload current about 33%; and significantly improving the steady state during damp heat test (about 50% improvement).

As replacement for the NiCr buffer layer material TiNi (Ti from 40-60 wt %); and AlNi (Al from 40-70 wt %) may be applied for the buffer layer. The composition Ni in NiCr alloy can also be adjusted more than 50 wt % Ni, preferably, 60-90 wt % Ni, more preferably, 70-80 wt % Ni. The electrical contact layer Cu has purity at least 99.9 wt % to provide reliable conductivity. Ag, Au, Pt or combination can be used in separately or in sequent to form combined electrode.

Figure 3:
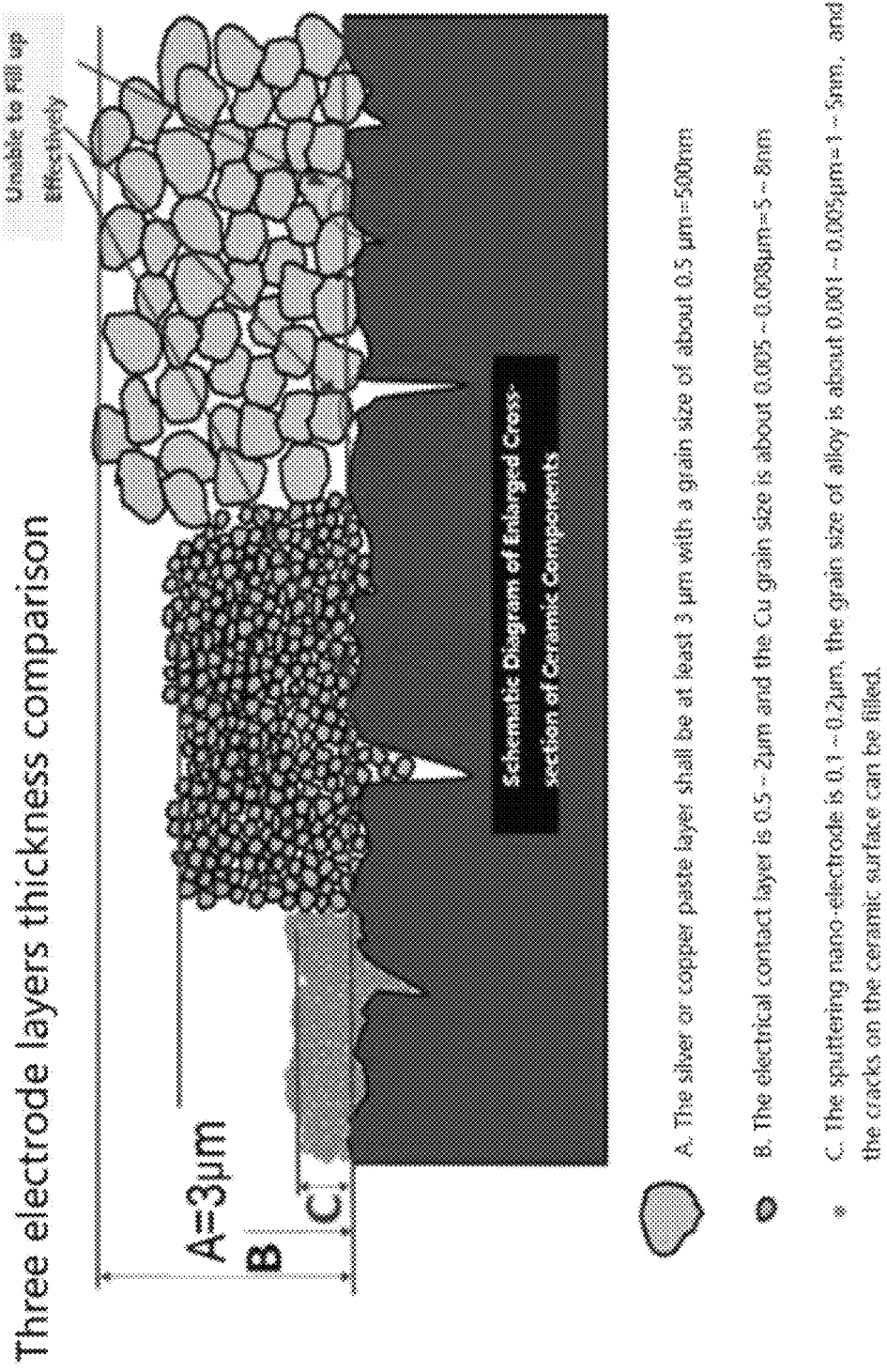
FIG. 3 comparison diagram between the sputtered NiCr/Cu multiple metal layer electrode and the traditional plating and Ag solidified net-printing electrode on ceramic substrate.

The ohmic contact principle is: the thermistor ceramic body forms resistance value because potential barrier forms grain boundary effect, and the size of its resistance is by number of grain boundaries and barrier height decision. In a traditional SPE process, it is to have materials such as Ag, Zn, terpinol fully to mix that the ground floor of semiconductor surface coating contains the Ag electrode, its viscosity, granularity, fusibility all can directly influence ohmic contact, the adhesive force of electrode, the electrical property of product, whether the fusing point of burning infiltration temperature and electrode slurry is appropriate, the height of temperature directly influences the adhesive force of product ceramic body and electrode layer, and the electrode contact resistance is also different thereupon. The difference compared between instant method and commercial techniques has shown in FIG. 3.

Traditional ceramic metal oxide varistor (MOV), or $BaTiO_3$-PTC (positive temperature coefficient) Thermistors, $Mn_3O_4$-NTC (negative temperature coefficient) Thermistors, Capacitors etc. produced by powder sintering technique. For example, the zinc oxide powder mixed with bismuth oxide, antimony oxide, manganese oxide and the like diffused to grain boundaries of zinc oxide for a MOV ceramic varistor. After the mixture is molded by a dry press process, organic binder is removed from the mixture and a ceramic resistor with nonlinear characteristics is generated from the molded mixture using a high-temperature sintering process.

The first metal buffer layer; the second metal contact layer, and optional the third or more metal layer are sequentially formed on the electrode. Preferably, including NiCr/Cu/Pt system, NiCr/Ag/Pt system, NiCr/Cu/Ag system, TiNi/Cu/Ag system, or AlNi/Cu/Ag system. The additional electrical contact layer may be formed by film depositing technique selected one from group consisting of electrical vapor deposition, chemical vapor deposition, magnetron sputtering deposition, electroless plating, screen printing, and thermal spraying. The additional electrical contact layer has the ability to improve electrical contacting, improve corrosion resistance, and improving the stability of the device.

While several embodiments and variations of the present invention are described in detail herein, it should be apparent for ordinary artisans that the disclosure and teachings of the present invention will suggest many alternative designs to those skilled in the art.

We claim:

1. A multiple metallic-layers electrode formed by a magnetron sputtering technique on a ceramic base substrate for a semiconductor device comprises:
    a) a buffer layer deposited on the ceramic base substrate includes at least one alloy selected form group consisting of NiCr with Ni form 50 wt % to 90 wt %, TiNi with Ti from 40 wt % to 60 wt %, and AlNi with Al from 40 wt % to 70 wt %, and a thickness of this buffer layer is from greater than zero to less than 100 nm, which fills surface cracks of the ceramic base substrate;
    b) an electrical contact layer deposited on the buffer layer includes at least one element selected from group consisting of Cu, Ag, Pt, Au, or combination;
    c) a thickness ratio of the electrical contact layer to the buffer layer is from 1 to 4;
    d) grain size of the electrical contact layer is less than 10 nm; and
    e) the ceramic base substrate is applied for at least one device from selected group consisting of ZnO-MOV (metal oxide varistors), $BaTiO_3$-PTC (positive temperature coefficient) Thermistors, $Mn_3O_4$-NTC (negative temperature coefficient) Thermistors, and Capacitors.

2. The multiple metallic-layers electrode of claim 1, the buffer layer in a) is NiCr with 80 wt % Ni.

3. The multiple metallic-layers electrode of claim 2, the electrical contact layer in b) is Cu.

4. The multiple metallic-layers electrode of claim 1, the electrical contact layer in b) is Cu.

5. The multiple metallic-layers electrode of claim 1, further comprises an additional electrical contact layer deposited on the electrical contact layer, wherein the additional electrical contact layer including at least one element selected from group consisting of Cu, Ag, Pt, Au, or combination.

6. The multiple metallic-layers electrode of claim 5, the additional electrical contact layer formed by a film depositing technique selected one from group consisting of electrical vapor deposition, chemical vapor deposition, magnetron sputtering deposition, electroless plating, screen printing, and thermal spraying.

7. The multiple metallic-layers electrode of claim 1, manufactured by the magnetron sputtering technique with a planar target, operates under base vacuum in a range of $5 \times 10^{-6}$ and $5 \times 10^{-8}$ Pa, an Ar gas flow rate in a range of 75-80 ml/s in a single sputtering chamber, a temperature in the single sputtering chamber during deposition processes is from room temperature to 150° C., and a forward power applied to the planar target to form the buffer layer and the electrical contact layer is in a range of 20 W to 5000 W.

8. The multiple metallic-layers electrode of claim 7, further comprising a stress release heat treatment at temperature 100-150° C. for less than 30 minutes.

* * * * *